United States Patent [19]

Blanchard et al.

[11] Patent Number: 4,753,900
[45] Date of Patent: Jun. 28, 1988

[54] METHOD OF FORMING ELECTRODES ALIGNED WITH RESPECT TO A LEVEL OF IMPLANTATION IN A SUBSTRATE AND A METHOD OF FORMING A CHARGE TRANSFER FILTER

[75] Inventors: Pierre Blanchard, Echirolles; Gérard Beal, St. Egreve, both of France

[73] Assignee: Thomson-CSF, Paris, France

[21] Appl. No.: 942,672

[22] Filed: Dec. 17, 1986

[30] Foreign Application Priority Data

Dec. 20, 1985 [FR] France ................. 85 18987

[51] Int. Cl.⁴ .................................. H02L 29/78
[52] U.S. Cl. .................................. 437/50; 437/53; 437/189; 357/24
[58] Field of Search ............... 357/24; 437/29, 50, 437/53, 189, 193, 228

[56] References Cited

U.S. PATENT DOCUMENTS

| | | | |
|---|---|---|---|
| 3,897,282 | 7/1975 | White | 29/571 |
| 4,026,733 | 5/1977 | Owen III, et al. | 148/1.5 |
| 4,065,847 | 1/1978 | Borel et al. | 29/578 |
| 4,086,609 | 4/1978 | Foxall et al. | 357/24 |
| 4,193,183 | 3/1980 | Klein | 29/578 |
| 4,243,433 | 1/1981 | Gibbons | 148/1.5 |
| 4,297,782 | 11/1981 | Ito | 29/571 |
| 4,347,656 | 9/1982 | Smith et al. | 29/571 |
| 4,377,899 | 3/1983 | Otani et al. | 29/578 |
| 4,553,316 | 11/1985 | Houston et al. | 29/571 |

Primary Examiner—Olik Chaudhuri
Attorney, Agent, or Firm—Oblon, Fisher, Spivak, McClelland & Maier

[57] ABSTRACT

The invention provides a method of forming electrodes aligned with respect to an implantation level in a substrate, including the following main phases:
  formation of a dielectric layer on a substrate;
  formation of semiconducting or conducting elements which are to serve as mask for implantation;
  implantation;
  formation of a layer of conducting or semiconducting material;
  cutting out electrodes from said layer and from the semiconducting or conducting elements.

6 Claims, 5 Drawing Sheets

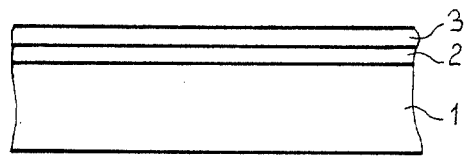
FIG_1
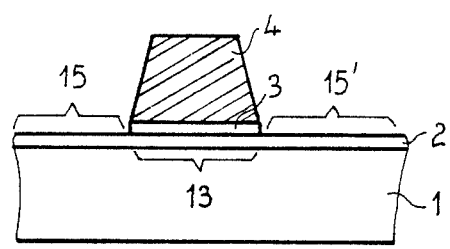
FIG_2
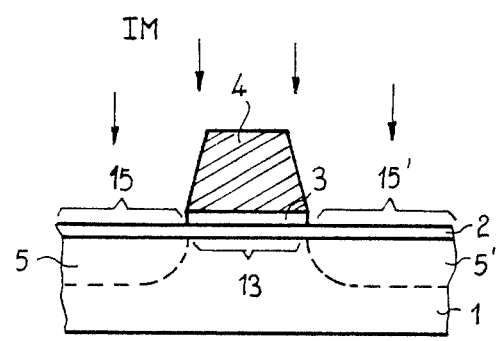
FIG_3
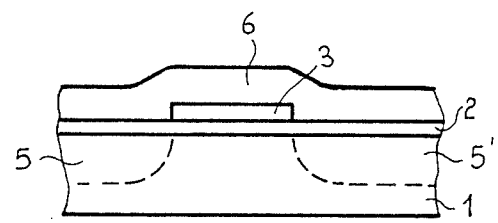
FIG_4

FIG_5
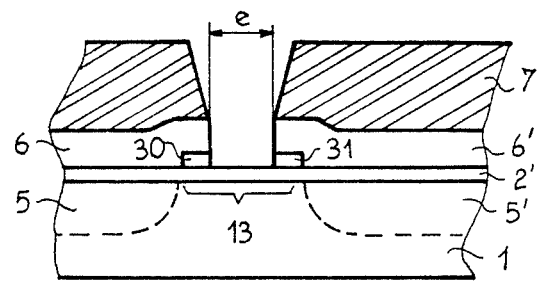
FIG_6
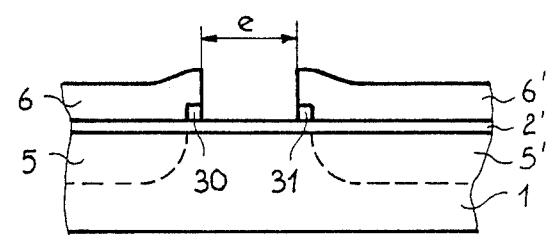
FIG_7
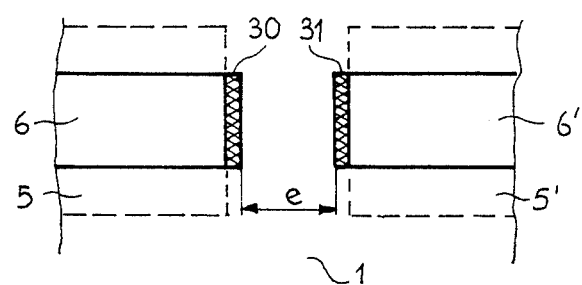

FIG_8
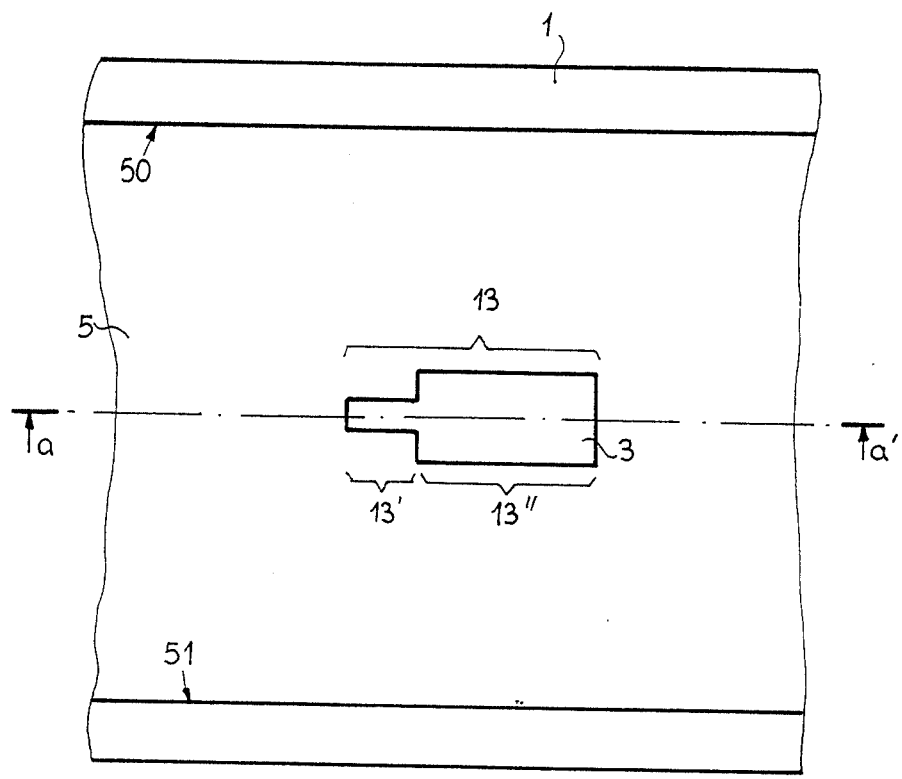
FIG_9
SECTION aa'
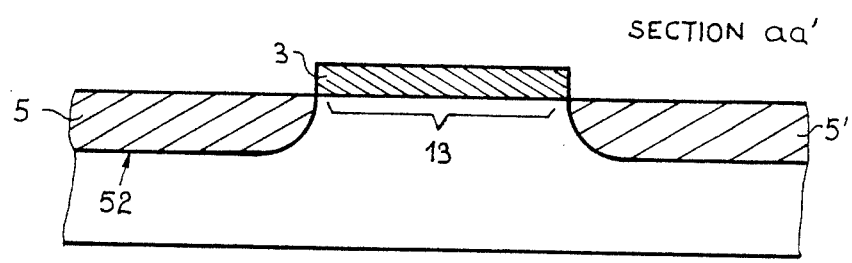

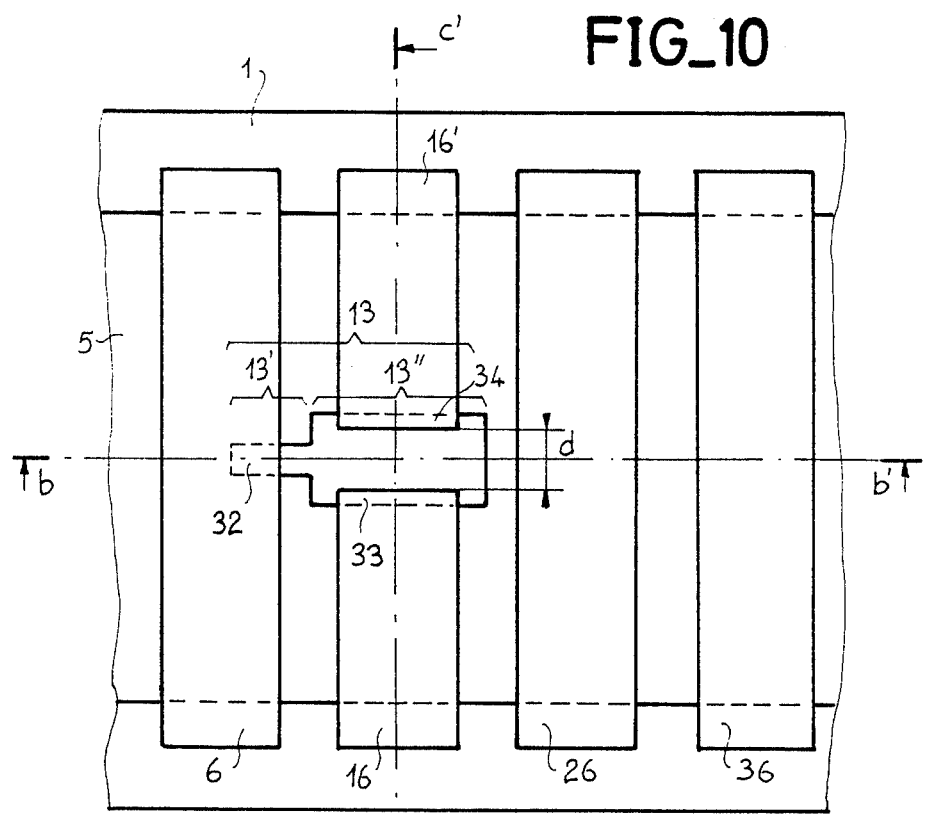
FIG_10
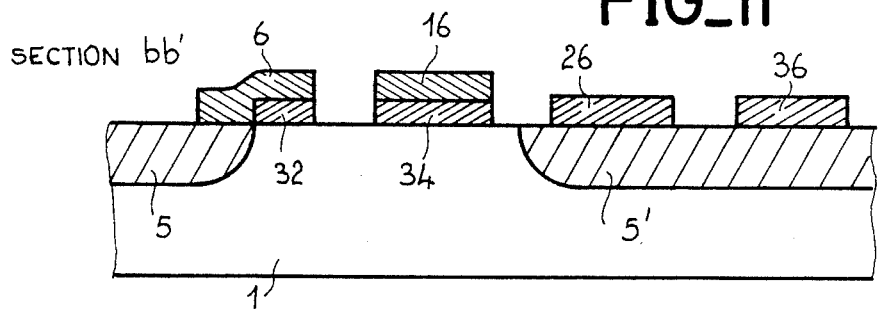
FIG_11
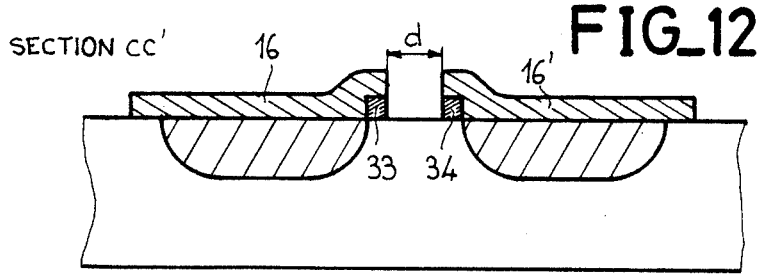
FIG_12

FIG_13
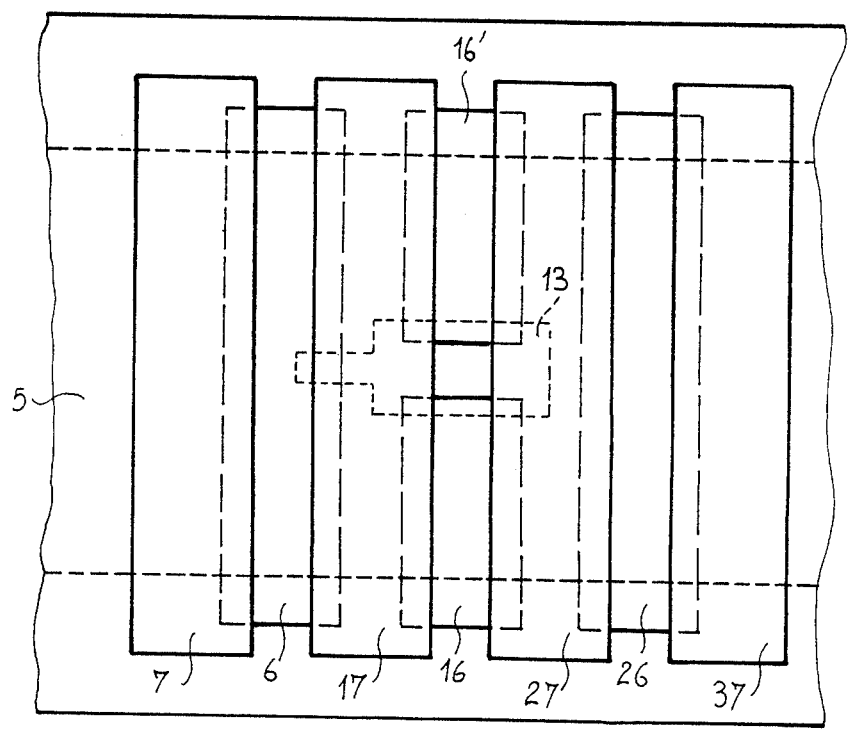

METHOD OF FORMING ELECTRODES ALIGNED WITH RESPECT TO A LEVEL OF IMPLANTATION IN A SUBSTRATE AND A METHOD OF FORMING A CHARGE TRANSFER FILTER

BACKGROUND OF THE INVENTION

The invention relates to a method of forming, on a substrate, electrodes aligned with respect to an implantation level formed in the substrate. It applies particularly to the construction of charge transfer devices and also relates to a method of forming a charge transfer filter.

Most ionic implantations using photosensitive resin for masking the implanted zones must be aligned with other levels. These implantations can only be made by using masks produced previously, which does not allow a great accuracy of alignment.

In fact, in some devices, a zone of a substrate has undergone ionic implantation and the implanted zone is covered with an electrode with an accuracy which is difficult to obtain using known methods.

The invention relats to a method for solving this problem.

SUMMARY OF THE INVENTION

The invention relates then to a method of forming electrodes aligned with respect to an implantation level in a substrate including the following successive steps:
(a) a first phase of forming a first layer of a dielectric material on a substrate;
(b) a second phase of forming a second layer of a semiconducting or conducting material;
(c) a third phase of removing the semiconducting or conducting material from the first zones where the implantations are to be formed, on each side of at least a seond zone where the semiconducting or conducting material is kept;
(d) a fourth phase for implanting more particularly said first zones;
(e) a fifth phase of forming a third layer of a semiconducting or conducting material;
(f) a sixth phase of cutting out from the third layer of semiconducting or conducting material and from the second layer of semiconducting or conducting material the electrodes separated from each other by a space situated in the second zone.

The invention also relates to a method of forming a charge transfer filter in which:
the zone where the semiconducting or conducting material is kept after the third removal phase, is oriented along a first axis and has along this axis at least one narrowed portion and one widened portion;
cutting out of the electrodes in the sixth phase includes the cutting out of at least one first electrode oriented perpendicularly to the axis and overlapping a part of the narrowed portion and two electrodes spaced from each other and oriented along a line perpendicular to the first axis and parallel to the first electrode, each half electrode overlapping the widened portion;
it includes a seventh phase of forming a fourth layer of a dielectric material followed by an eighth phase of forming a fifth layer of a semiconducting or conducting material, then a nineth phase of cutting out from the fifth layer of semiconducting or conducting material electrodes parallel to the electrodes cut out in the sixth phase and each one overlapping two of these electrodes of the sixth phase or one electrode and two half electrodes.

BRIEF DESCRIPTION OF THE DRAWINGS

The different objects and characteristics of the invention will be clearer from the following description given by way of example with reference to the accompanying Figures which show:

FIGS. 1 to 7, different steps of one example of the method of implementing electrodes substantially aligned with respect to an implantation level in a substrate in accordance with the invention; and FIGS. 8 to 13, different steps of one example of the method of forming a charge transfer filter in accordance with the invention.

DETAILED DESCRIPTION OF THE INVENTION

Referring to FIGS. 1 to 7, one example of the method of aligning electrodes with respect to an underlying implantation zone will be described first of all.

In the most usual case, it is a question of aligning implanted zones with electrodes made from polycrystalline silicon.

In a first phase of the method of the invention, a first layer 2 of a dielectric material is formed on a semiconductor substrate 1.

During a second phase, shown in FIG. 1, a second layer 3 of a semiconducting or conducting material such as polycrystalline silicon is formed.

During a third phase, the semiconducting material of layer 3 is removed from the zones where an ionic implantation is to be carried out. The present phase is accomplished, for example, by photolithographic etching and is shown in FIG. 2 where we find, by way of example, a stud 4 made from a photosensitive material which has allowed the semiconducting material not protected by the stud 4 to be removed by photolithographic etching. Thus two zones are defined 15 and 15' which are not covered by the layer of semiconducting material 3 and a zone 13 covered by the semiconducting material layer 3.

During a fourth phase, an ionic implantation is carried out such as shown in FIG. 3 by the arrows IM. Zones 15 and 15' undergo this implantation whereas zone 13 is protected by the semiconducting material layer 3. Zones 5 and 5' of substrate 1, underlying the zones 15 and 15' are thus implanted. The stud 4 of photosensitive material is then removed by means known in the photolithographic etching technique.

During a fifth phase a layer 6 of a semiconducting or conducting material such as polycrystalline silicon is formed, as shown in FIG. 4.

Finally, during a sixth phase, using a layer 7 of a photosensitive material, electrodes 6 and 6' are etched by photolithography in the semiconducting material layer previously deposited. The layer 7 of photosensitive material leaves free a space e situated at the position of zone 13 comprising the semiconducting material of layer 3, thus, the semiconducting material of layer 3 may also be etched by photolithography. In FIG. 5, this photolithographic etching leaves portions 30 and 31 of layer 3 and the two electrodes obtained are formed respectively of a layer 6 and of a portion 30 of semiconducting material on the one hand and, on the other, of a layer 6' and a portion 31 of semiconducting material.

The space e may be chosen and situated so as to eliminate practically completely the portions 30 and 31 of layer 3. Then electrodes 6 and 6' are obtained which cover the implanted zones 5 and 5' substantially accurately.

After elimination of photosensitive layers 7, a substrate 1 is obtained, as shown in FIG. 6 and FIG. 7 which shows a top view of FIG. 6, having two zones 5 and 5' which have undergone an ionic implantation. Two electrodes 6 and 6' partially cover these implanted zones. The space e existing between the electrodes 6 and 6' may be increased so as to reduce the size of portions 30 and 31. Thus, the opposite edges of electrodes 6 and 6' may coincide with the limits of the implanted zones 5 and 5' and electrodes 6 and 6' are obtained aligned with the implantations 5 and 5'.

Generally, a material is used for layer 3, serving for masking during implantation, is of the same kind as that used for forming layer 6.

Referring to FIGS. 8 to 13, a method will now be described of forming a charge transfer filter applying the above described method.

In fact, one of the applications of this method is the provision of the coefficiencts of a charge transfer filter with fixed weighting.

The coefficients are generally defined by the so called cut electrode technique which allows each stage of the charge transfer shift register to split the charge packet transferred into two, allowing this charge packet (image of a sample of the signal) to be weighted by a non destructive reading method at times n TH (TH being the transfer period) so that transverse filtering function to be provided after the summation.

It is necessary in the case of small geometry technologies to be able to correctly align the parts of the electrode defining the weighting coefficient with respect to the transfer channel of the register and more particularly with respect to the absence of channel which allows the charge packets to be isolated from each other on the one hand and a predivision to be provided at the level of the preceding electrode.

For a better definition of the coefficient and a correct transfer at a high frequency, this absence of channel must be of very small geometry and perfectly positioned with respect to the first polycrystalline silicon level implementing the electrodes, and this within the two axes.

In this application, the fact of being able to position the first polycrystalline silicon level with respect to the implementation defining the channel of the register is of primary importance if it is desired to reduce the geometries, whence the advantage of the method of the invention.

A method will then now be described of forming such a charge transfer filter with reference to the different phases of the method already described.

As shown in FIGS. 8 and 9, a stud 3 made from polycrystalline silicon covering a zone 13 is formed using the first, second and third preceding phases. According to the method of the invention, this stud has a narrowed portion and a widened portion aligned along an axis aa', defining for zone 13 a narrowed portion 13' and a widened portion 13''.

During the fourth phase of the method of the invention, the ionic implantation takes place in the substrate 1 not covered by the semiconducting or conducting material stud 3 and is limited in FIG. 8 at its upper part along a line 50 and at its lower part along a line 51.

In FIG. 9, the ionic implantation is carried out in zones 5 and 5' separated by zone 13 and limited in depth along a line 52.

In a fifth phase not shown, a layer of a semiconducting or conducting material is then formed. This layer may be formed with a material of the same kind as that of stud 3. But it may also be of a different kind. Particularly, in the case of silicon, the first deposition may be polycrystalline silicon, the second deposition of tantalum, for example, so as to form a tantalum silicon after aknealing.

In a sixth phase, electrodes 6, 16, 26, 36 parallel with each other and perpendicular to the axis aa' are cut out from the preceding layer and from stud 3.

One electrode 6, for example, overlaps the narrowed portion 13' corresponding to zone 13 of FIG. 10. An adjacent electrode partially covering the widened portion 13'' is formed as two half electrodes 16 and 16' separated by a space d oriented along axis bb'. The half electrodes overlap the widened portion 13'' of zone 13.

Other electrodes such as 26 and 36 may be formed.

As shown in FIGS. 11 and 12, there are thus obtained at least:
one electrode 6 partially covering the narrowed portion 13' and then including a portion 32 of stud 3;
a first half electrode 16 partially covering the widened portion 13'' and including a portion 33 of stud 3;
a second half electrode 16' also partially covering the widened portion 13'' opposite the first half electrode 16 and including a portion 34 of stud 4.

The different electrodes obtained cover the ionic implantation previously formed.

The overlapping of the electrodes on zone 3 may be reduced to a minimum and therefore the portions 32, 33, 34 of stud 3 also.

During a seventh phase, a layer of a dielectric material is formed, not shown in the Figures.

During an eighth phase, a layer of a semiconducting or conducting material is formed.

Finally, during a nineth phase, electrodes 7, 17, 27, 37 are cut out from the semiconducting or conducting material layer deposited in the eighth phase as far as the dielectric of the seventh phase.

These electrodes 7, 17, 27, 37, are disposed parallel to the electrodes and half electrodes 6, 16, 16', 26 previously formed and in a staggered arrangement with respect to these electrodes so as to cover the spaces between these electrodes along the axis bb'.

Thus a charge transfer filter is obtained such as shown in FIG. 13.

In this Figure, the zone having undergone ionic implantation is shown by a short broken line, zone 13 not being implanted.

The first electrodes formed 6, 16, 16', 26 are shown with a long broken line for their parts which are hidden by the electrodes formed during the nineth phase.

The second electrodes formed 7, 17 27 and 37 are shown with a thick continuous line.

It is obvious that the above descriptions of the method have been given solely by way of example.

The shapes of the electrodes and half electrodes 6 to 36 and 7 to 37 as well as of zone 13 and stud 3 may be different without departing from the spirit of the invention.

The dimensions of the non implanted zone as well as the dimensions of the spaces between the electrodes and between the half electrodes may be chosen depending on the specific applications without them forming a limit to the present invention.

What is claimed is:

1. A method of implementing electrodes substantially aligned with respect to an implantation level in a substrate, including the following successive steps:
   (a) a first phase of forming a first layer of a dielectric material on a substrate;
   (b) a second phase of forming a second layer of a semiconducting or conducting material;
   (c) a third phase of removing the semiconducting or conducting material from first zones where implantations are to be provided, on each side of at least a second zone where the semiconducting or conducting material is kept;
   (d) a fourth phase of implanting more particularly said first zones;
   (e) a fifth phase of forming a third layer of a semiconducting or conducting material;
   (f) a sixth phase of cuting out, from the third layer of semiconducting or conducting material and from the second layer of semiconducting or conducting material, electrodes separated by a space, said space situated in the second zone.

2. The method according to claim 1, wherein said third phase of removing the semiconducting or conducting material is performed by photolithographic etching.

3. The method according to claim 1, wherein said sixth phase of cutting out is performed by photolithographic etching.

4. The method according to claim 1, wherein said second layer of semiconducting or conducting material and said third layer of semiconducting or conducting material are of the same kind of material.

5. A method according to claim 1, for forming a charge transfer filter wherein:
   the second zone were the semiconducting or conducting material is kept following the third removal phase, is oriented along a first axis and has along this axis at least one narrowed portion and one widened portion;
   the sixth phase of cutting out electrodes comprises
     cutting out at least one first electrode oriented perpendicularly to the first axis and overlapping a part of the narrowed portion, and
     cutting out two half electrodes spaced from each other and oriented along a line perpendicular to the first axis and paralell to the first electrode, each half electrode overlapping the widened portion;
   and further comprising:
     a seventh phase of forming a fourth lay er of a dielectric material,
     an eighth phase of forming a fifth layer of a semiconducting or conducting material, and
     a nineth phase of cutting out from the fifth layer of semiconducting or conducting material electrodes parallel to the electrodes cut out in the sixth phase and each the nineth phase electrodes overlapping two of the electrodes of the sixth phase or one electrode and two half electrodes of the sixth phase.

6. The method according to claim 1, wherein said second layer of semiconducting or conducting material and said third layer of semiconducting or conducting material are of different kinds of material.

* * * * *